United States Patent [19]
Jaffe

[11] 3,941,629
[45] Mar. 2, 1976

[54] DIAPHRAGM FORMATION ON SILICON SUBSTRATE

[75] Inventor: James M. Jaffe, Southfield, Mich.

[73] Assignee: General Motors Corporation, Detroit, Mich.

[22] Filed: Apr. 11, 1974

[21] Appl. No.: 460,106

[52] U.S. Cl. .......................... 156/8; 156/17; 357/26
[51] Int. Cl.[2] ............................................ C23F 1/02
[58] Field of Search .................. 156/8, 11, 17, 345; 357/26

[56] References Cited
UNITED STATES PATENTS

| | | | |
|---|---|---|---|
| 3,032,753 | 5/1962 | Knapp et al. | 156/345 |
| 3,810,796 | 5/1974 | Skaggs et al. | 156/17 |
| 3,819,431 | 6/1974 | Kurtz et al. | 156/7 |

OTHER PUBLICATIONS

J. Hoekstra, "Metal Etch Monitor," IBM Technical Disclosure Bulletin, Vol. 14, No. 9, Feb. 1972, pp. 2680–2682.

M. Chwalow, "Etch Completion Indication," IBM Technical Disclosure Bulletin, Vol. 15, No. 2, July 1972, pp. 606–607.

Primary Examiner—Douglas J. Drummond
Assistant Examiner—Brian J. Leitten
Attorney, Agent, or Firm—Robert J. Wallace

[57] ABSTRACT

A method of making thin diaphragms having an accurately controllable thickness for semiconductor pressure responsive devices. An oxide coating is thermally grown in selected regions on the front side of a silicon wafer. The oxide extends into the wafer at an extremely accurate and controllable depth to form a groove in the wafer front side defined by the selected regions. Portions of the wafer are then etched from the back side until the bottom of the groove is reached thereby providing a diaphragm having a thickness equal to the accurately reproducible depth of the groove.

2 Claims, 14 Drawing Figures

EXAMPLE 1

EXAMPLE 2

DIAPHRAGM FORMATION ON SILICON SUBSTRATE

BACKGROUND OF THE INVENTION

This invention relates to diaphragms for semiconductor devices. More particularly, it involves a method of making thin diaphragms of an accurately controllable thickness for semiconductor pressure transducers.

Generally, prior art semiconductor pressure transducers can be produced by etching central portions of the back side of a wafer until enough of the wafer has been removed to provide a diaphragm of the desired thickness. In production, however, it has been found that the etch rate is often inconsistent as it depends upon various factors such as the strength of the etchant solution. For example, where the same etchant is used to etch a plurality of wafers one at a time, the strength of the etchant solution diminishes according to the number of wafers which it has etched. Therefore, one had to periodically remove the wafer from the etchant and measure the diaphragm to determine its thickness. This process is tedious and one can easily over-etch the wafer. Hence, uniform diaphragm thickness is extremely difficult to obtain, especially between devices processed on different wafers. While techniques have been developed to automatically stop the etch on reaching a layer of etch resistant material, they still rely upon the inconsistent etch rate to ultimately define the diaphragm thickness. Moreover, until now no practical method has been developed in which diaphragms of a thickness on the order of several microns or less can be reproduced accurately and consistently between different wafers during production.

Uniform diaphragm thickness would substantially reduce calibration of the individual devices. Such calibration has heretofore been needed because the pressure transducer response is inversely proportional to the square of the diaphragm thickness. If one could accurately control the thickness of the diaphragms, response of all the pressure transducers produced in production would be substantially equivalent. By providing extremely thin diaphragms of about several microns thick, the sensitivity of the pressure transducers can be greatly enhanced. Hence, the diameter of the diaphragm can be decreased for a given pressure range to be sensed. Therefore, more devices per wafer can be produced.

OBJECTS AND SUMMARY OF THE INVENTION

Therefore, it is an object of this invention to provide a practical method of producing semiconductor diaphragms having a thickness that is accurately and reproducibly controlled.

It is a further object of this invention to provide a practical method of producing extremely thin diaphragms of about several microns thick for semiconductor pressure transducers that are accurately controllable so as to provide uniform diaphragm thickness for a plurality of devices in production.

These and other objects of the invention are accomplished by masking a front side of a silicon wafer to expose selected regions thereon. Preferably, the selected regions are in the shape of an annulus which defines the outer periphery of each pressure transducer device to be formed from the wafer. An oxide coating is thermally grown in the selected regions. The oxide extends into the wafer at a depth which is extremely accurate and controllable to form a groove in the wafer front side defined by the selected regions. The back side of the wafer is selectively masked to expose a desired diaphragm pattern and circumventing portions in registry with the groove. The exposed portions of the wafer are then etched from the back side until the bottom of the groove is reached thereby providing a diaphragm having a thickness equal to that of the accurately controllable groove depth.

DESCRIPTION OF THE PREFERRED EMBODIMENT

Example 1

Example 1 shows a fragmentary plan view of a silicon wafer 10. For ease of illustration, the method of this invention will be described in connection with processing one pressure transducer device. However, it should be noted that hundreds of these devices can be processed as part of wafer 10. Generally, the wafer is about 2 inches in diameter and about 4 mils thick. There can be approximately 600 pressure transducers processed within the wafer, depending on wafer size. The wafer 10 can be either monocrystalline or polycrystalline silicon. The wafer 10 has two major parallel surfaces, the front side 12 and the back side 14.

Figure 1:
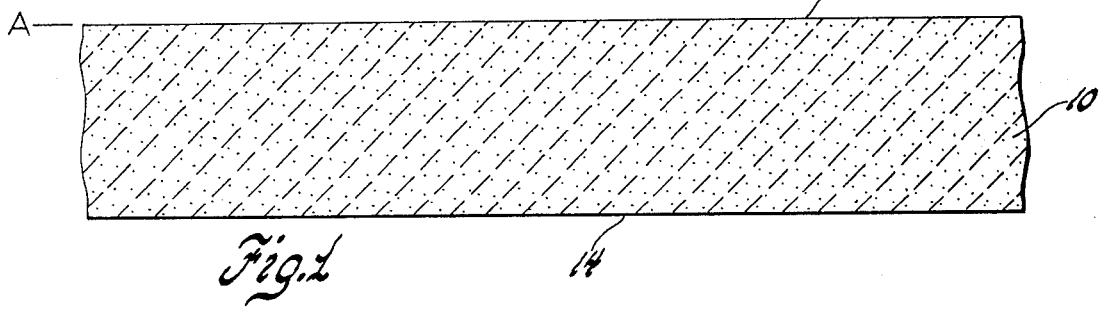
FIGS. 1 through 7 show fragmentary plan views of successive steps of one embodiment of the method of this invention.
Figure 2:
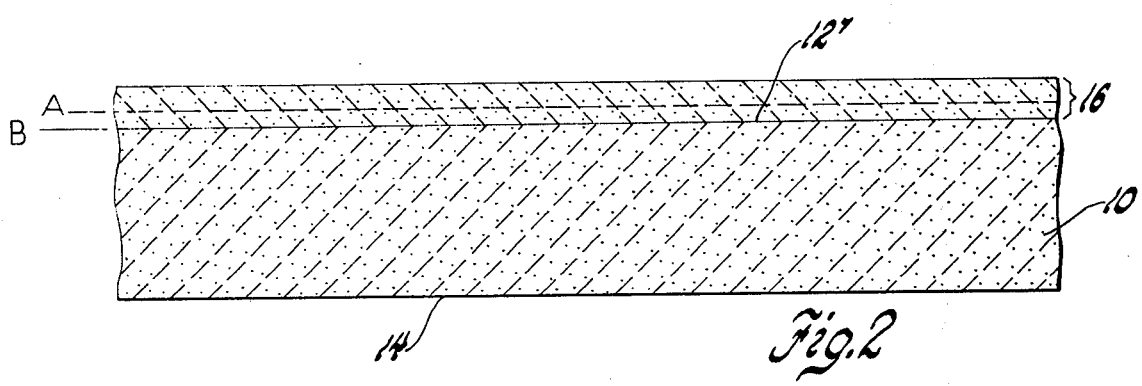

Referring now to FIG. 2, a layer 16 of silicon dioxide is grown in steam on the front side of the water. The empirical expression for silicon dioxide growth in steam is give by:

$$x^2 = Ate^{-E_a/kT} \tag{1}$$

Where $x$ is the oxide thickness, $t$ is exposure time in minutes, $E_a$ is the activation energy, and $k$ is Boltzman's constant, $A$ is an empirical constant and $T$ is temperature in °K. This equation can be reduced to $$x = \sqrt{Ct} \tag{2}$$

where $C$ is a constant derived from the constant variables in equation (1), for a given temperature and pressure. For example, silicon dioxide layer 16 was grown in atmospheric steam at 1200°C for 1000 minutes. This resulted in a thickness of 4 microns for silicon dioxide layer 16. For ease of illustration the oxide thicknesses will be shown enlarged with respect to the wafer 10 thickness. It is important to note that 45% of the oxide thickness will be below the original silicon wafer surface (designated as A in FIG. 2) and 55% will be above the original wafer surface A. This leaves a new silicon wafer front side which will now be designated as 12'. The silicon wafer front side 12' now has a surface after this first oxidation that will be designated by B.

The silicon dioxide layer 16 and the subsequent oxide growths described in this invention are grown by thermal oxidation of silicon. By thermal oxidation, I mean heating silicon at an elevated temperature in the presence of oxygen. In this example, a clean silicon wafer is placed in a furnace. The furnace temperature is chosen between 1100°C to 1250°C. Oxygen which has been previously saturated with steam or water vapor is passed over the wafer for the length of time ($t$) required to grow the thickness of oxide needed. The water vapor is picked up by the oxygen by bubbling the oxygen through hot water (about 100°C) before it passes through the furnace.

Figure 3:
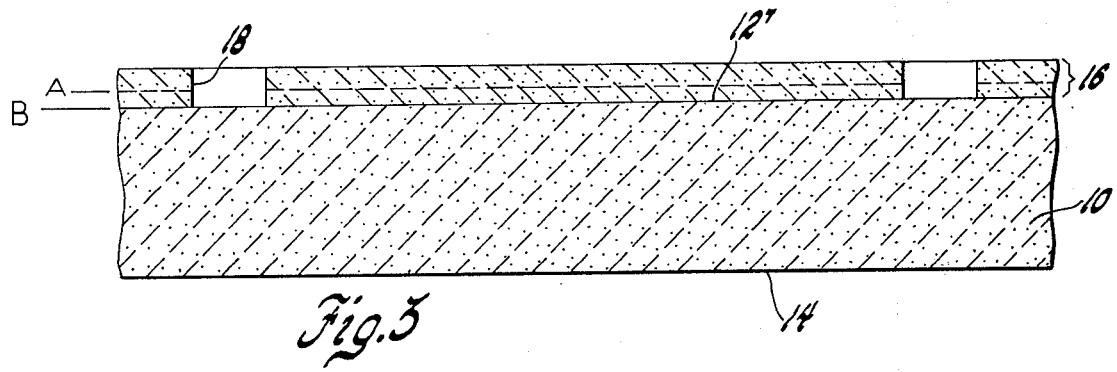

Referring now to FIG. 3, the next step is to remove selected regions 18 of the silicon dioxide layer 16. The selected regions 18 are in the form of an annulus the inner diameter of which will later generally define the outer periphery of each discrete pressure transducer to be formed from the wafer 10. It should be realized that while in this example the selected regions are in the form of an annulus, other desired shapes may of course be used. The removal of the selected regions 18 is accomplished by using known photolithographic techniques using for example KTFR as a maskant and etching the unmasked portions with an etchant which does not attack silicon, such as hydrofluoric acid. The removal of the selected regions 18 exposes portions of the front side 12' of the wafer 10.

Figure 4:
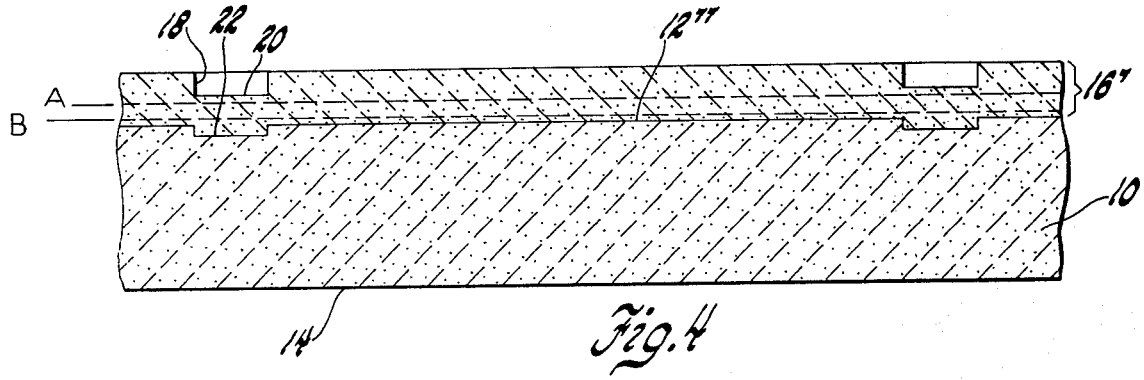

The front side of the wafer is then thermally oxidized as shown in FIG. 4 for a second selected time period to form an oxide coating 20 in the area of the selected regions 18 on the exposed wafer front side 12'. It should be noted that the original oxide layer 16 also has grown larger. Therefore, this layer will now be designated as 16'. However, due to the non-linearity in oxide growth with respect to time, the silicon dioxide coating 20 will have extended further into the silicon wafer 10 than the silicon dioxide layer 16'. This extension of the oxide growth into the silicon wafer 10 forms an annular groove 22. The depth of this groove 22 is very highly controllable. For example, the thickness of oxide layer 16' is given by $$x_{16'} = \sqrt{C(T_1 + t_2)} \quad (3)$$

and the thickness of the new oxide coating 20 is given by $$X_{20} = \sqrt{Ct_2} \quad (4)$$

It should be noted that the new front side of the silicon wafer 10 is below that which was designated by B. Hence, this new silicon wafer front side will be designated as 12''.

For example, if the second selected oxidation time period ($t_2$) is 1000 minutes, to calculate the depth of groove 22:

The distance from A to B equals:

$$X_{AtoB} = 0.45 \times (\sqrt{Ct_1}) \quad (5)$$

The distance from B to the bottom of groove 22 equals:

$$X_{Bto22} = 0.45 \times (\sqrt{Ct_2}) \quad (6)$$

The distance from A to 12'' equals:

$$X_{Ato12''} = 0.45 \times (\sqrt{C(t_1 + t_2)}) \quad (7)$$

Therefore, the depth of groove 22 equals:

$$X_{AtoB} + X_{Bto22} - X_{Ato12''} = (0.45) \times \sqrt{C} \times (\sqrt{t_1} + \sqrt{t_2} - \sqrt{t_1 + t_2}) \quad (8)$$

We have determined that for $t_1 = 1000$ minutes and $t_2 = 1000$ minutes, with the oxide being grown in atmospheric steam at 1200°C, the groove 22 depth will be 2.43 microns. The depth of the groove is uniform not only throughout the entire wafer 10, but is accurately controllable within about ±5% between different wafers. It should be noted that the depth can be varied easily and accurately by varying the factors that determine the constant, $C$, such as temperature, pressure, etc. The depth can also be varied even more easily by merely adjusting the time periods for the oxide growths, leaving $C$ constant.

Figure 5:
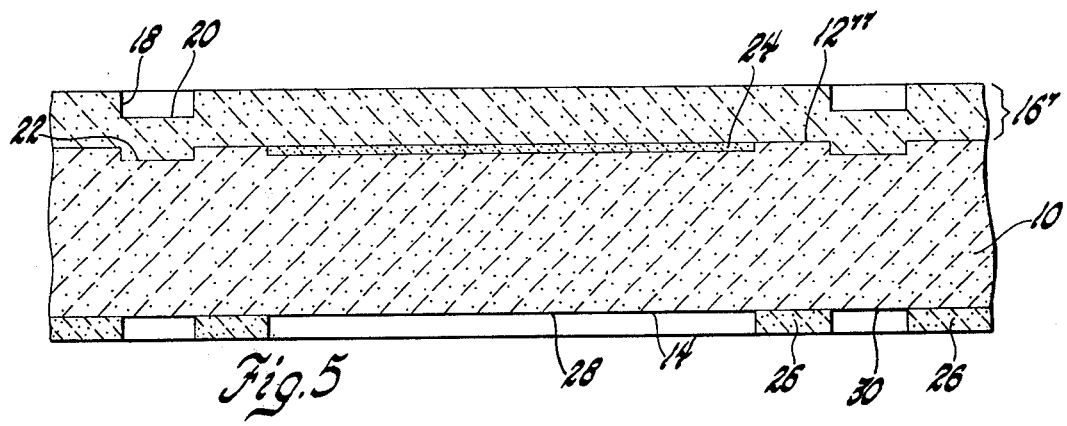

Referring now to FIG. 5, after formation of the groove 22, a resistor pattern is etched into the silicon dioxide layer 16' and pressure responsive elements, such as resistors 24 can be diffused or implanted into the wafer front side 12'' as is well known in the art. The back side 14 of the wafer 10 is masked with a suitable etchant resist 26 such as silicon dioxide which has been selectively etched as in the formation of selected regions 18. The etchant resist mask leaves exposed circular windows 28 corresponding to the central portions of the diaphragms to be formed from the silicon wafer 10. The etchant resist 26 also exposes circumscribing annular gaps 30 in register with the groove 22.

Figure 6:
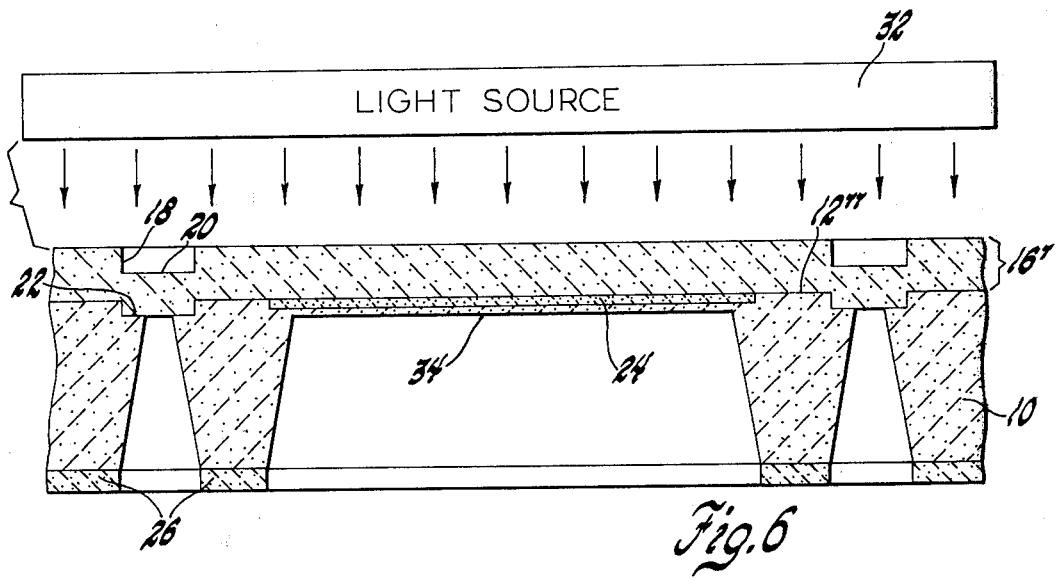

As shown in FIG. 6, a light source 32 is then directed at the front side of the wafer 10. For example, the wafer can be placed into a thin walled, transparent beaker containing room temperature potassium hydroxide and the light shone through the beaker walls at the front side of the wafer. The light source 32 emits a light having a wave length which is absorbed by silicon and readily passes through silicon dioxide. This would be toward the blue end of the visible spectrum. The wafer 10 is then etched from the back side 14 until one can see the light source 32 through the oxide coating 20 in the groove 22, at which point the etch is immediately quenched. The preferred etchant for this etch is potassium hydroxide, but other suitable etchants which readily etches the silicon wafer 10 but does not rapidly etch silicon dioxide can also be used. As one can see in FIG. 6, this etching produces diaphragms 34 which have a thickness equal to that of the highly controllable groove 22 depth. In this example, the thickness of diaphragm 34 is about 2.43 microns.

Figure 7:
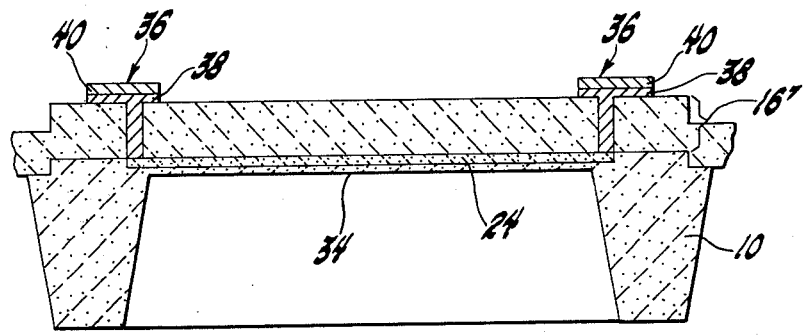

Metallic contacts 36 are then added to make electrical connection to the pressure responsive resistor 24. For example, the metallic contacts 36 can be bi-layered, having a first evaporated layer 38 of chromium over which a layer 40 of gold has been evaporated. The individual pressure transducers are then separated from the wafer to leave the finished device shown in FIG. 7.

Example 2

Figure 8:
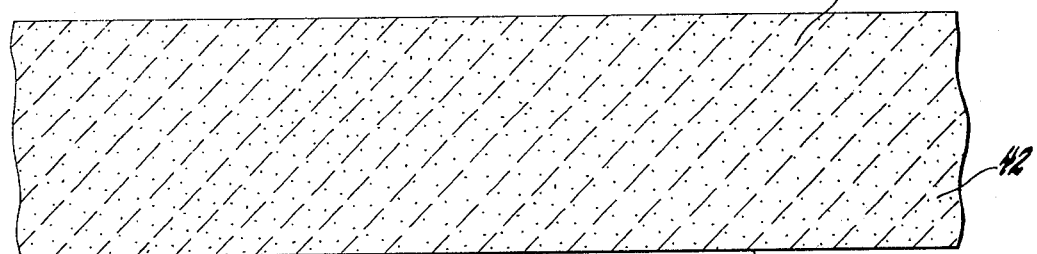
FIGS. 8 through 14 show fragmentary plan views of successive steps of another embodiment of the method of this invention.
Figure 9:
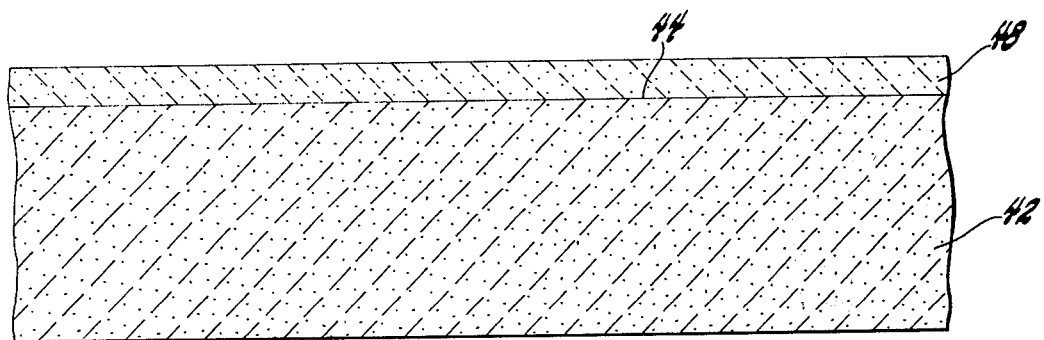
Figure 10:
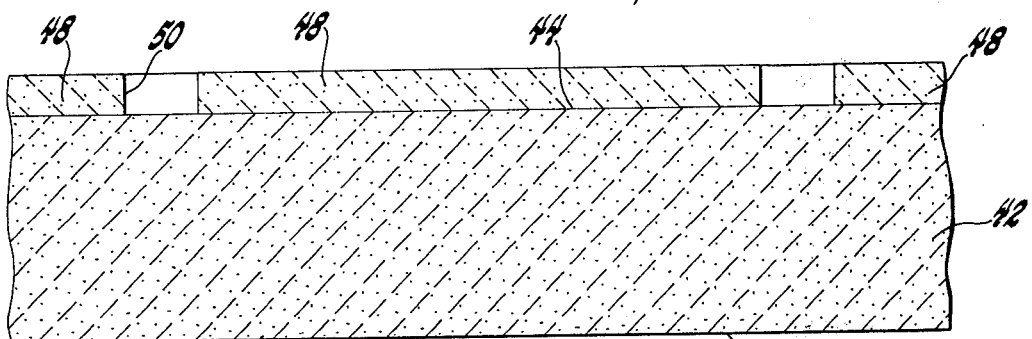

Another embodiment of this invention is illustrated by the successive steps shown in FIGS. 8 through 14. FIG. 8 shows a silicon wafer 42 similar to that of wafer 10 and Example 1. The silicon wafer 42 has a front side 44 and a back side 46. An oxygen impervious maskant 48, such as silicon nitride, is applied on the front side 44 of the wafer, as shown in FIG. 9. The next step, as shown in FIG. 10, is to remove selected regions 50 of the maskant 48. As in Example 1, the selected regions 50 can be in the shape of an annulus which defines the outer periphery of the pressure transducer to be formed from the wafer.

Figure 11:
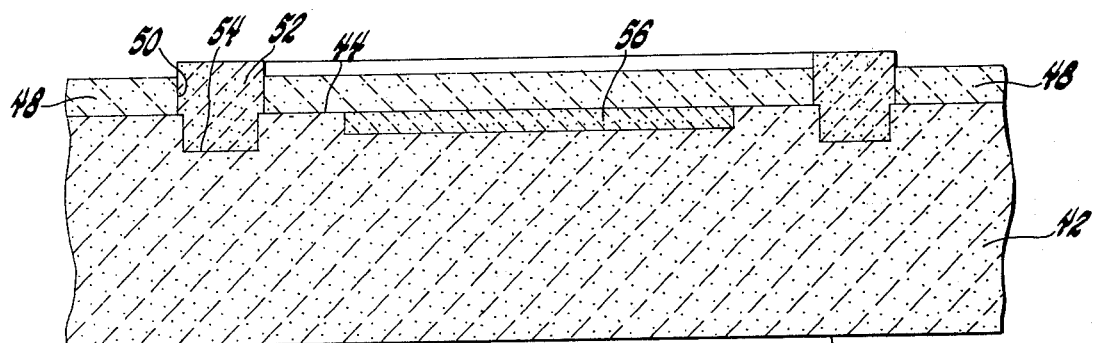
Figure 12:
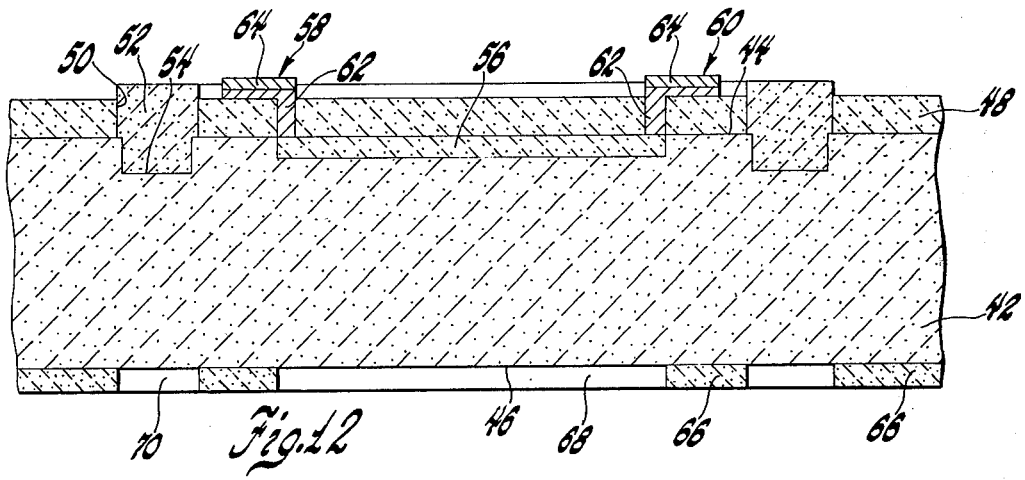

As shown in FIG. 11, the exposed portions of the wafer front side 44 is then thermally oxidized to grow a silicon dioxide coating 52 thereby forming groove 54 in the areas of the selected regions 50. This oxidation forms groove 54 in the front side of the wafer in the same manner as was explained in Example 1. The depth of the groove is accurately controllable. The depth of the groove 54 is given by the equation:

$$X_{54} = (0.45) \times \sqrt{Ct}$$

where $X_{54}$ is the depth of the groove 54 as measured from the wafer front side 44 to the bottom of the groove 54, with $C$ and $t$ being the same variables as defined in Example 1. For example, if the oxide coating 52 is grown in atmospheric steam at 1200°C for 1000 minutes, the depth of the groove 54 would be:

$$X_{54} = (0.45) \times 4 \text{ microns} = 1.8 \text{ microns}$$

As was described in Example 1, the depth of the groove 54 can be varied according to the time of oxidation, for a given pressure and temperature. Hence, if one desired a deeper groove, be merely oxidizes for a longer time period.

Resistors 56 or other pressure responsive devices can now be diffused or implanted in the front side of the wafer by known techniques using in the silicon nitride 48 as a maskant.

Metal contacts 58 and 60 are added to make electrical contact to the opposite ends of the resistor 56. For example, the top of the wafer can be masked with KMER exposing only two windows over opposite ends of the resistor 56. Then a first layer 62 of chromium is evaporated onto the wafer to make electrical contact to the resistor 56. A second layer 64 of gold can then be evaporated on top of the chromium layer 62 to provide a good wire bondable surface for making connection to external circuitry. The back side 46 of the wafer is then masked as in Example 1 with an etchant resist 66. As in Example 1, the etchant resist mask exposes circular windows 68 corresponding to central portions of the diaphragm to be formed from the wafer 42 and also exposes circumscribing annular gaps 70 which correspond to the groove 54. It should be noted that window 68 can be other than circular if a different diaphragm geometry is desired.

Figure 13:
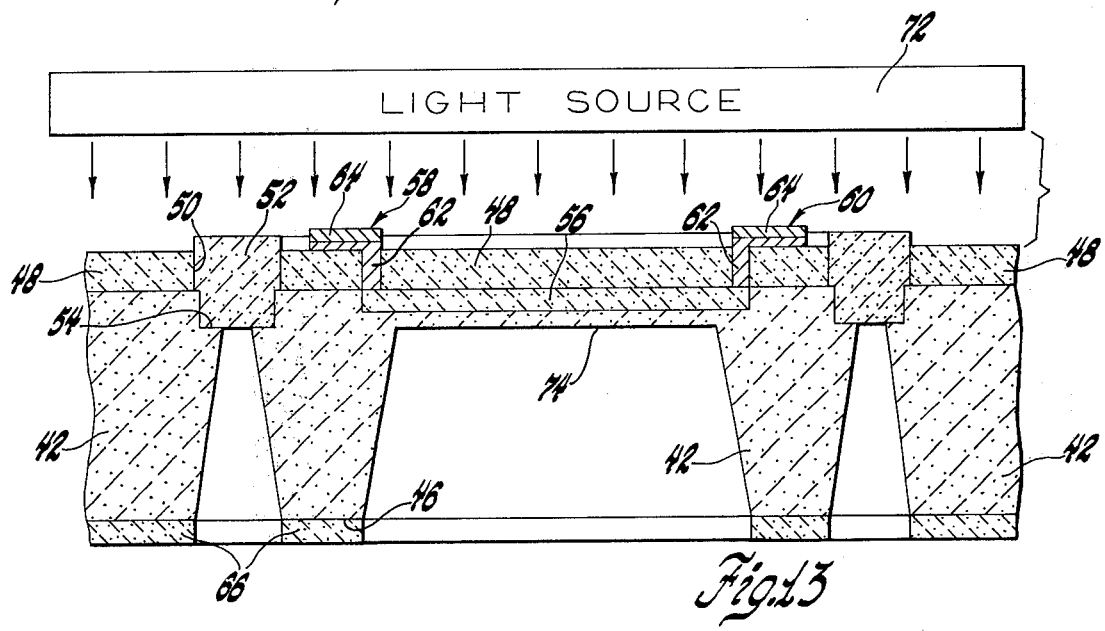
Figure 14:
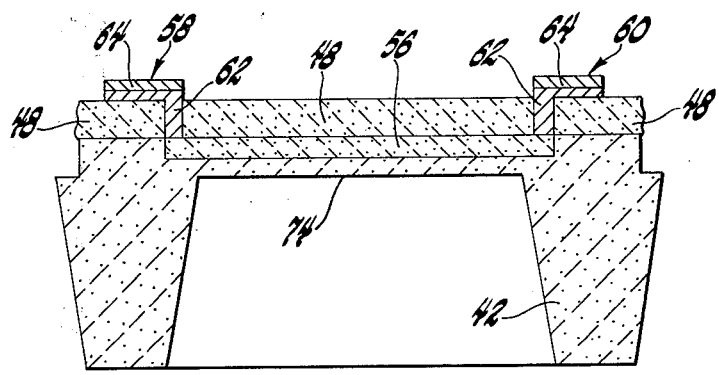

Turning now to FIG. 13, the light source 72 is shown on the front side of the wafer. As in Example 1, the light source 72 emits a light having a wave length which is absorbed by the silicon and readily passes through the silicon dioxide coating 52 in the oxide groove 54. The wafer 42 is then etched from the back side 46 until one can see the light source 72 through the oxide groove 54, at which point the etch is immediately quenched. As in Example 1, a preferred etchant is potassium hydroxide or any other suitable etchant which readily etches the silicon wafer 42 but does not rapidly etch silicon dioxide or the metallic contacts 58 and 60. As one can see in FIG. 13, this produces diaphragms 74 which have a thickness equal to that of the highly controllable oxide groove 54 thickness. FIG. 14 shows the finished pressure responsive device after the individual devices have been separated from the wafer and the oxides removed therefrom.

It should be noted that the etching process which incorporates the use of the blue light source has been found to be the most practical method. However, one could use other methods for knowing when to stop the etch. For example, after the groove has been formed by the highly controllable thermal oxidation process just described, the oxide could be removed and a thin coating of photoresist be applied in the groove. Then when the wafer is etched from the backside the individual devices will break apart automatically from their own weight as soon as the wafer is etched up to the bottom of the groove.

Examples 1 and 2 have disclosed unique methods for providing extremely thin diaphragms for semiconductor devices. It should be noted that while this invention has been described in connection with making diaphragms for semiconductor pressure transducers, this method could be employed in producing diaphragms for other types of devices such as photo sensitive devices which require thin diaphragms. It can now be realized that this unique method is particularly useful because it does not require any preferential etch or particular crystallographic orientation of the silicon wafer. In contrast this invention provides the unique method of producing highly controllable and accurately reproducibly thin diaphragms as it relies on the totally predictable rate of growth of oxides on a silicon wafer.

What is claimed is:

1. A method of making semiconductor pressure transducers having thin and accurately reproducible diaphragms, said method comprising:
   1. oxidizing a silicon wafer for a first time period to form an oxide growth on the front side of the wafer;
   2. selectively removing the oxide growth in at least one selected annular region defining the outer periphery of each pressure transducer to be formed from the wafer;
   3. reoxidizing the wafer for a second time period to form an annular oxide filled groove of precisely predetermined depth in the wafer front side defined by said selected annular region, wherein said depth precisely corresponds to a desired pressure transducer diaphragm thickness;
   4. forming at least one pressure responsive element on the wafer front side within an area circumscribed by said annular groove;
   5. selectively masking the back side of the wafer, leaving exposed a portion of a desired diaphragm geometry aligned with said area and a spaced circumscribing annular portion aligned with said groove;
   6. etching said exposed portions of the wafer from its back side to simultaneously form a recess and spaced encircling groove; and
   7. stopping the etch precisely upon said encircling groove reaching the bottom of said oxide filled groove thereby providing a discrete pressure transducer with a diaphragm having a precisely determined thickness equal to that of the precisely determined oxide filled groove depth.

2. A method of making semiconductor pressure transducers having thin and accurately reproducible diaphragms, said method comprising:
   1. oxidizing a silicon wafer for a first time period to form an oxide growth on the front side of the wafer;
   2. selectively removing the oxide growth in at least one selected annular region defining the outer periphery of each discrete pressure transducer to be formed from the wafer;

3. reoxidizing the wafer for a second time period to form an oxide filled annular groove of a precisely predetermined depth in the wafer front side defined by said selected annular region, wherein said depth precisely corresponds to a desired pressure transducer diaphragm thickness;
4. forming at least one pressure responsive element on the wafer front side within an area bounded by said annular groove;
5. selectively masking the back side of the wafer, leaving exposed a portion of a desired diaphragm geometry aligned with said area and a spaced circumscribing annular portion aligned with said groove;
6. shining a light having a wave length which is absorbed by silicon and passed by silicon dioxide into the front side of the wafer;
7. etching said exposed portions of the wafer from its back side to simultaneously form a recess and a spaced encircling groove; and
8. stopping the etch immediately upon observation of the light through the oxide in the oxide filled groove, thereby providing a discrete pressure transducer with a diaphragm of a precise thickness equal to the precisely predetermined oxide filled groove depth.

* * * * *

UNITED STATES PATENT AND TRADEMARK OFFICE
CERTIFICATE OF CORRECTION

PATENT NO. : 3,941,629
DATED : March 2, 1976
INVENTOR(S) : James M. Jaffe

It is certified that error appears in the above–identified patent and that said Letters Patent are hereby corrected as shown below:

Column 3, line 38, the formula "$X_{16'} = \sqrt{C(T_1 + t_2)}$" should read -- $X_{16'} = \sqrt{C(t_1 + t_2)}$ --.

Column 3, line 67, the formula ending "$\sqrt{t_1 30 t_2)}$" should read -- $\sqrt{t_1 + t_2)}$ --.

Column 5, line 24, "be merely" should read -- he merely --.

Signed and Sealed this

*fifteenth* Day of *June 1976*

[SEAL]

Attest:

RUTH C. MASON
*Attesting Officer*

C. MARSHALL DANN
*Commissioner of Patents and Trademarks*